(12) United States Patent
Balz

(10) Patent No.: US 11,240,946 B2
(45) Date of Patent: Feb. 1, 2022

(54) CIRCUIT BOARD FOR A CONTROL DEVICE FOR A VEHICLE, METHOD FOR PRODUCING A CIRCUIT BOARD FOR A VEHICLE, AND METHOD FOR PRODUCING A CONTROL DEVICE FOR A VEHICLE

(71) Applicant: Robert Bosch GmbH, Stuttgart (DE)

(72) Inventor: Stefan Balz, Besigheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/008,132

(22) Filed: Jun. 14, 2018

(65) Prior Publication Data

US 2018/0368295 A1 Dec. 20, 2018

(30) Foreign Application Priority Data

Jun. 20, 2017 (DE) .......................... 102017210297.7

(51) Int. Cl.
*H05K 9/00* (2006.01)
*H05K 1/02* (2006.01)
*H05K 3/40* (2006.01)
*H05K 1/11* (2006.01)

(52) U.S. Cl.
CPC ......... *H05K 9/0024* (2013.01); *H05K 1/0216* (2013.01); *H05K 1/0218* (2013.01); *H05K 9/0009* (2013.01); *H05K 9/0028* (2013.01); *H05K 9/0032* (2013.01); *H05K 1/115* (2013.01); *H05K 3/4007* (2013.01); *H05K 2201/0715* (2013.01); *H05K 2201/09609* (2013.01); *H05K 2201/09618* (2013.01); *H05K 2201/10371* (2013.01)

(58) Field of Classification Search
CPC combination set(s) only.
See application file for complete search history.

(56) References Cited

U.S. PATENT DOCUMENTS

| | | | |
|---|---|---|---|
| 5,605,477 A * | 2/1997 | Wu ....................... | H01R 13/658 439/620.24 |
| 2004/0240191 A1* | 12/2004 | Arnold ................... | H01L 23/04 361/800 |
| 2009/0097220 A1* | 4/2009 | Lee ................... | H01L 23/49816 361/774 |
| 2017/0290207 A1* | 10/2017 | Smith .................. | H05K 9/0024 |

FOREIGN PATENT DOCUMENTS

| | | |
|---|---|---|
| CN | 1707766 A | 12/2005 |
| CN | 103813625 A | 5/2014 |
| CN | 104135814 A | 11/2014 |

* cited by examiner

*Primary Examiner* — James Wu
*Assistant Examiner* — Hung Q Dang
(74) *Attorney, Agent, or Firm* — Norton Rose Fulbright US LLP; Gerard Messina

(57) ABSTRACT

A circuit board for a control device for a vehicle includes a clamp edge for clamping on a cover for covering circuit board, the clamp edge being formed by an electrically conductive layer that is situated on an upper side of the circuit board. The circuit board has a plurality of solder bumps for shielding an electromagnetic radiation, the solder bumps being arranged in a row in clamp edge, and each of solder bumps being insulated from the electrically conductive layer by a ring of solder resist.

8 Claims, 3 Drawing Sheets

CIRCUIT BOARD FOR A CONTROL DEVICE FOR A VEHICLE, METHOD FOR PRODUCING A CIRCUIT BOARD FOR A VEHICLE, AND METHOD FOR PRODUCING A CONTROL DEVICE FOR A VEHICLE

CROSS-REFERENCE TO RELATED APPLICATIONS

The present application claims priority under 35 U.S.C. § 119 to DE 10 2017 210 297.7, filed in the Federal Republic of Germany on Jun. 20, 2017, the content of which is hereby incorporated by reference herein in its entirety.

BACKGROUND

There are many technologies both for limiting the radiation of electromagnetic interference by circuit boards, and also in particular for keeping their susceptibility to such interference low.

SUMMARY

The present application is pertains to a circuit board for a control device for a vehicle, as well as a method for producing a circuit board for a vehicle, and a method for producing a control device for a vehicle.

According to an example embodiment, a circuit board for a control device for a vehicle includes: a clamp edge for clamping on a cover for covering the circuit board, the clamp edge being formed by an electrically conductive layer situated on an upper side of the circuit board; and a plurality of solder bumps for shielding electromagnetic radiation, the solder bumps being configured in a row in the clamp edge, each of the solder bumps being insulated from the electrically conductive layer by a ring of solder resist.

A circuit board can be made of an electrically insulating base material and can act as a barrier for electronic components. Standardly, the circuit board can be realized with multiple layers. A control device can be an electronic module that can be installed in a vehicle in order to control and/or to regulate the vehicle. The vehicle can be a vehicle for personal transportation, for example a highly automated vehicle. The clamp edge can surround the circuit board in the manner of a frame. The electrically conductive layer of the clamp edge can be connected to a ground terminal of the circuit board. The clamp edge can in addition be designed to have a plurality of solder bumps and vias. A cover can advantageously be made of metal and in addition can be joined to the circuit board in order to form a closed unit and to shield the circuit board. Solder bumps can be small spheres situated at contact surfaces of the circuit board. A ring of solder resist that surrounds the solder bumps can prevent the surfaces coated with the resist on the circuit board from being wetted by flowing solder during the soldering process.

The electromagnetic radiation can be radiation having a frequency that can impair a function of the control device. The shielding of the electromagnetic radiation from the circuit board ensures the electromagnetic compatibility (EMC) of the control device, and problem-free functioning of the control device in an electromagnetic environment is ensured without influencing other devices or itself being negatively influenced. The approach presented here enables very good EMC sealing of a circuit board for a control device for a vehicle using known materials and production steps.

Through the described approach, a so-called integrated EMC shielding can be realized. Here, the approach can be used instead of or in addition to approaches in which EMC sealing pastes (conductive) or ring/pipe seals in the form of conductive/coated plastics/metal meshes are used. Advantageously, for the approach based on solder bumps described here, no additional production steps are required during control device assembly, such as dispensing liquid/pastelike sealing materials or joining in the case of solid-body seals. In addition, the solder, which is already used anyway, provides protection of material pairings and material compatibilities. Functionality is also ensured over the useful life of the equipment, for example due to temperature influence and changes of temperature.

According to an example embodiment, the solder bumps are configured in a chain structure on the clamp edge, a distance between the solder bumps being adapted to a frequency of the electromagnetic radiation. The distances, adapted to a wavelength of the electromagnetic radiation, between the solder bumps in the chain structure prevent the penetration of electromagnetic radiation.

According to an example embodiment, each of the solder bumps can be connected to the electrically conductive layer by a branch line that bridges the ring of solder resist. The ring of solder resist protects the circuit board from corrosion and mechanical damage, and during soldering prevents the wetting of the surfaces on the circuit board coated with it. Via a branch line, a solder bump can be brought to the same electrical potential as the electrically conductive layer. Advantageously, the solder bumps can be grounded via the branch lines.

According to an example embodiment, the circuit board can have an electrically conductive shielding layer, each of the solder bumps being connected to the shielding layer by a via unit. The shielding layer is for example the so-called ground layer (GND layer), made of a metal, for example copper. In this way, the solder bumps can be grounded via the shielding layer.

According to an example embodiment, the circuit board has a plurality of EMC via units for shielding the electromagnetic radiation. The EMC via units can be configured in a row in the clamp edge and connected to the electrically conductive layer. The EMC of the electrical controlling of the vehicle ensures problem-free functioning of the vehicle in an electromagnetic environment without influencing other devices or itself being negatively influenced.

According to an example embodiment, the circuit board can be made having at least one electrical component situated on the upper side of the circuit board. Such a component can for example be an integrated circuit.

According to an example embodiment, a control device for a vehicle includes a circuit board as described and a cover lying on the plurality of solder bumps. In this way, a direct and electrically conductive contact can be provided between the cover and the plurality of solder bumps. In addition to an electromagnetic shielding of the control device, it may be appropriate or necessary to use the cover to shield the control device against contamination.

According to an example embodiment, the circuit board can be equipped on both sides. In this case, another cover can be situated on the side of the circuit board opposite the first-named cover. According to an example embodiment, the two covers can be screwed together by a screw connection. In this way, an adequate pressure of the first-named cover on the solder bumps can be securely achieved.

According to an example embodiment, a method for producing a circuit board for a control device for a vehicle includes: providing a bearer plate; situating an electrically conductive layer on the bearer plate in order to form a clamp edge; and configuring a plurality of solder bumps in a row in the clamp edge for shielding an electromagnetic radiation, each of the solder bumps being insulated from the electrically conductive layer by a ring of solder resist. Here, the solder resist is a protective layer for the circuit board and in addition reduces the consumption of solder in the reflow soldering process.

According to an example embodiment, a method for producing a control device for a vehicle includes: providing a circuit board as described; providing a cover; and placing the cover onto the plurality of solder bumps.

In the method for producing a control device for a vehicle, in the step of placement, the cover can be pressed against the circuit board, the cover thus being joined to the circuit board in order to make it possible to form a closed and shielded unit.

In the present context, a control device can be understood as an electrical device that processes sensor signals and outputs control and/or data signals as a function thereof. The control device can have an interface that can be realized as hardware and/or as software. In the case of a realization as hardware, the interfaces can for example be part of a so-called system ASIC that contains a wide variety of functions of the control device. However, it is also possible for the interfaces to be separate integrated circuits or to be made up at least partly of discrete components. In the case of a realization as software, the interfaces can be software modules present for example on a microcontroller alongside other software modules.

Exemplary embodiments of the approach presented here are shown in the drawings and are explained in more detail in the following description.

DETAILED DESCRIPTION

Figure 1:
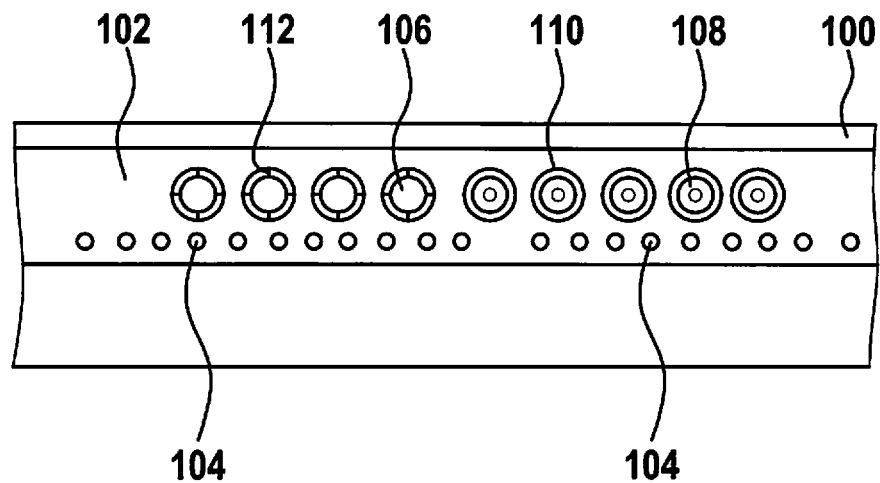
FIG. 1 shows a top view of a segment of the circuit board according to an example embodiment of the present invention.

In the following description of advantageous exemplary embodiments of the present invention, identical or similar reference characters are used for elements shown in the various figures having similar function, and repeated description of these elements is omitted.

FIG. 1 shows a top view of a segment of circuit board 100 according to an exemplary embodiment. Circuit board 100 includes a clamp edge 102, clamp edge 102 being situated on an upper side of the circuit board and formed by an electrically conductive layer. According to an exemplary embodiment, the electrically conductive layer of clamp edge 102 is connected to a ground terminal of circuit board 100. EMC via units 104 are optionally placed on clamp edge 102 in a chain structure. In addition, a plurality of solder bumps 106, 108 are situated on clamp edge 102, each of the solder bumps 106, 108 being insulated from the electrically conductive layer of clamp edge 102 by a ring of solder resist 110. Solder bumps 106, 108 can be realized in two different variants. At the left in the figure, solder bumps 106 have at least one, here a plurality of, for example in each case four, thin branch lines 112 via which they are connected to the electrically conductive layer of clamp edge 102 of circuit board 100. In addition or alternatively, solder bumps 108 are connected to a shielding layer by a via unit, as is shown at the right side of the figure.

On circuit board 100 there can be placed a cover that in the mounted state sits on solder bumps 106, 108. Solder bumps 106, 108 are provided to prevent undesirable electromagnetic radiation from being able to penetrate through a gap between circuit board 100 and the cover.

According to an exemplary embodiment, EMC vias 104 are attached to the shielding layer on clamp edge 102 of circuit board 100. In addition, structures having the plurality of circular solder bumps 106, 108 and a ring of solder resist 110 surrounding solder bumps 106, 108 are situated on clamp edge 102 in a chain structure. The distance between individual solder bumps 106, 108 here corresponds approximately to the distance between the individual EMC via units 104, and is adapted to the frequencies to be shielded.

Solder bumps 106, 108 are either contacted to the shielding layer of circuit board 100 with a via unit, or are connected to the upper side metallization by a thin and fragile branch line 112. Branch line 112 is made thin so that during the re-melting process, solder bumps 106, 108 remain circular and do not flow away.

According to the depicted exemplary embodiment, EMC vias 104 are situated in a straight row. Solder bumps 106, 108 are also situated in another straight row. Here, the rows of EMC vias 104 and solder bumps 106, 108 are configured parallel to one another. For example, solder bumps 106, 108 are situated closer to an outer edge of circuit board 100 than are EMC vias 104. Solder bumps 106, 108 are surrounded around their entire circumferences by the electrically conductive layer. Alternatively to a straight-line configuration, solder bumps 106, 108 can for example be configured in a zigzag shape, or in a wave shape.

According to an exemplary embodiment, clamp edge 102 extends over the entire length of at least one side of circuit board 100, or extends in the manner of a frame circumferentially along an outer edge of circuit board 100. Clamp edge 102 can here extend up to the outer edge of circuit board 100 or can be separated from the outer edge of circuit board 100 by a narrow strip. For example, clamp edge 102 has a width between 3 and 15 mm.

According to an exemplary embodiment, the row of solder bumps 106, 108 runs continuously over an entire length of clamp edge 102. Here, adjacent solder bumps 106, 108 throughout the row of solder bumps 106, 108 each has a defined spacing that results in a shielding of an electromagnetic radiation impinging on the row of solder bumps 106, 108. According to an exemplary embodiment, the otherwise continuous row of solder bumps 106, 108 is interrupted by a via through which a fastening device, for example a screw, can be guided, by which the cover can be fastened to circuit board 100.

According to an alternative exemplary embodiment, the row of solder bumps 106, 108 includes exclusively solder bumps 106 having branch lines 112, or exclusively solder bumps 108 having via units.

Figure 2:
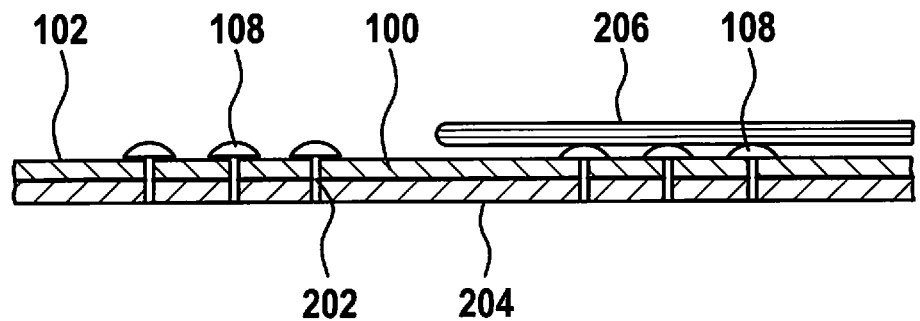
FIG. 2 shows a cross-sectional view of a circuit board according to an example embodiment of the present invention.

FIG. 2 shows a cross-sectional view of a circuit board 100 according to an exemplary embodiment. This can be an exemplary embodiment of the circuit board shown in FIG. 1.

In the section shown in FIG. 2 through circuit board 100, solder bumps 108 are shown that are connected to a shielding layer 204 by a via unit 202. According to this exemplary embodiment, shielding layer 204 is situated on a side of circuit board 100 situated opposite solder bumps 108.

On the left side of the figure, solder bumps 108 are seen in cross-section, via unit 202 of the solder bumps extending from clamp edge 102 up to shielding layer 204, through a plurality of layers of circuit board 100. On the right side of the figure, solder bumps 108 are also seen in cross-section, but in this part of the figure a cover 206 is already joined to circuit board 100. As can be seen in the figure, the join causes a pressing of solder bumps 108. Through this pressing, it can be ensured that cover 206 lies against all solder bumps 108, regardless of manufacturing tolerances relating to the height of solder bumps 108. According to this exemplary embodiment, adjacent solder bumps 108 are spaced far enough from one another that, even after the pressing, there remains a gap between the adjacent solder bumps and thus between circuit board 100 and cover 206.

In general, the height of solder bumps 108 can be controlled via a solder paste pressure. Here, solder paste pressure is understood as the application of solder paste onto circuit board 100 that is to be equipped, with the aid of a pressure template made of steel or plastic, and using a paste pressure machine. In this way, various shapes are possible on the upper side of circuit board 100, defining a supply of more or less solder paste, which can then result in higher or flatter solder bumps 108 in the melting process. Here, pressure magnitudes and bending can be taken into account when selecting the height of the solder bumps.

During the joining of metallic cover 206, the relatively soft solder paste material used for the solder bumps, containing a high portion of tin, has the result that solder bumps 108 are slightly pressed in, so that an electrical contacting arises. Similar to the EMC via units, the shielding effect results from suitably chosen spacings of solder bumps 108.

Figure 3:
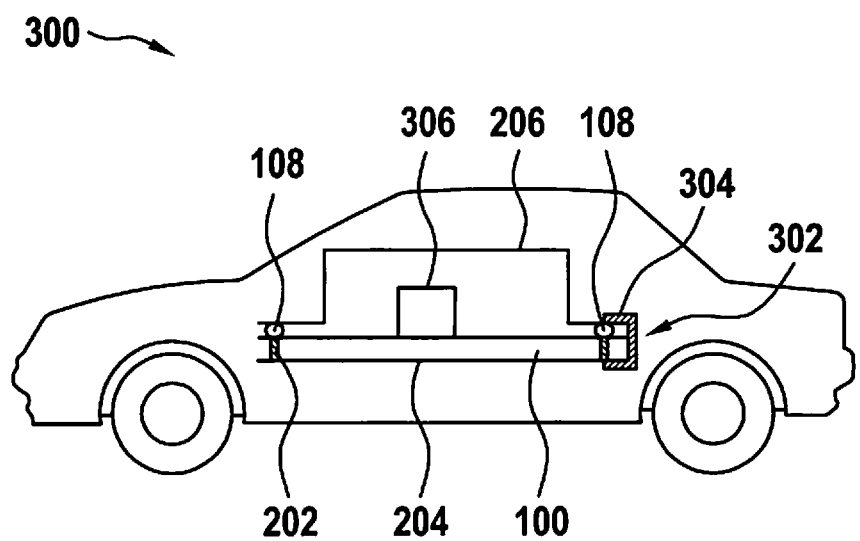
FIG. 3 schematically shows a vehicle having a control device according to an example embodiment of the present invention.

FIG. 3 shows a schematic view of a vehicle 300 having a control device 302 according to an exemplary embodiment. In the figure, vehicle 300 includes control device 302, which in turn includes a circuit board 100 having a cover 206 as described on the basis of the preceding figures. In order to fasten cover 206 to circuit board 100, a clamp device 304 is shown (purely schematically) that for example can be regarded as representing a screw connection or a clamp. In addition, in FIG. 3, solder bumps 108 are shown on which an edge of cover 206 is placed. Circuit board 100 is standardly equipped with a plurality of elements, of which a component 306 is shown as an example.

Control device 302 includes circuit board 100 and cover 206, the example clamp device 304 pressing cover 206 onto circuit board 100 and thus joining circuit board 100 to cover 206. The joining of cover 206 also has the result that solder bumps 108 are slightly pressed in, thus producing an electrical contacting. Cover 206 is formed such that it lies tightly on the clamp edge of circuit board 100, but provides enough space for component 306 in the center of circuit board 100. Here, cover 206 is used to shield component 306 and for the connection of component 306, and thus ensures its proper functioning. In an exemplary embodiment, cover 206 is fastened on circuit board 100 by a screw device.

In an exemplary embodiment, circuit board 100 is equipped on both sides, and a further cover is provided on the rear side of circuit board 100 in order to also shield the rear side. In this case, according to an exemplary embodiment, the two covers are connected to one another by at least one screw connection. By tightening the screw connection, circuit board 100 is clamped between the covers, and cover 206 is joined to circuit board 100.

In this representation, circuit board 100 includes only those solder bumps 108 that are connected to shielding layer 204 by a via unit 202. In addition or alternatively, circuit board 100 is provided with solder bumps that, as shown in FIG. 1, are connected via branch lines to the electrically conductive layer of the clamp edge of circuit board 100.

Figure 4:
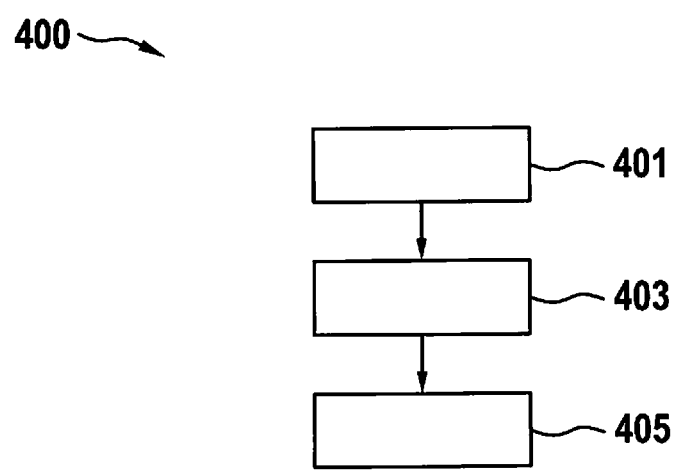
FIG. 4 is a flowchart that illustrates a method for producing a circuit board for a control device for a vehicle according to an example embodiment of the present invention.

FIG. 4 is a flowchart of a method 400 for producing a circuit board for a control device for a vehicle according to an exemplary embodiment. This can be a circuit board as described on the basis of the preceding figures. In a step 401, a bearer plate (not shown) is provided. In a step 403, an electrically conductive layer is situated on the bearer plate (not shown) in order to form a clamp edge. In a step 405, a plurality of solder bumps are configured in a row in the clamp edge. Here, each of the solder bumps is insulated from the electrically conductive layer by a ring of solder resist.

Figure 5:
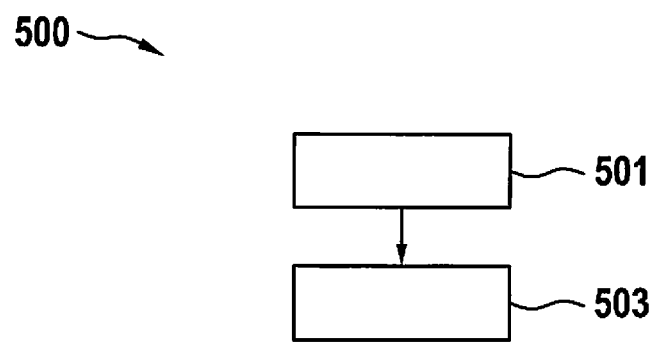
FIG. 5 is a flowchart that illustrates a method for producing a control device for a vehicle according to an example embodiment of the present invention.

FIG. 5 is a flowchart of a method 500 for producing a control device for a vehicle according to an exemplary embodiment. This can be a control device as described on the basis of FIG. 3. In a step 501, a circuit board and an associated cover are provided. Subsequently, in a step 503, the cover is placed onto the plurality of solder bumps of the circuit board, and, in the step of placement 503, the cover is pressed against the circuit board in order in this way to join the cover to the circuit board.

If an exemplary embodiment has an "and/or" linkage between a first feature and a second feature, this is to be read as meaning that according to a specific embodiment the exemplary embodiment has both the first feature and the second feature, and according to a further specific embodiment the exemplary embodiment has either only the first feature or only the second feature.

What is claimed is:

1. A circuit board for a control device for a vehicle, comprising:
a clamp edge for clamping on a cover for covering the circuit board, the clamp edge being formed on electrically conductive layer situated on an upper side of the circuit board, wherein the electrically conductive layer of the clamp edge is connected to a ground terminal of the circuit board;
a plurality of solder bumps for shielding an electromagnetic radiation, the solder bumps being arranged in a row in the clamp edge, each of the solder bumps being insulated from the electrically conductive layer of the clamp edge by a ring of solder resist; and
a plurality of electromagnetic compatibility (EMC) vias for shielding the electromagnetic radiation, wherein the EMC vias are configured in a row in the clamp edge and are connected to the electrically conductive layer, wherein the rows of EMC vias and solder bumps are spaced apart and configured parallel to one another;
wherein each of the solder bumps, each of which is insulated from the electrically conductive layer by the ring of solder resist, is connected to the electrically conductive layer by a plurality of electrically conductive branch lines that bridges the ring of solder resist, wherein the solder bumps are in a chain structure on the clamp edge, a distance between the solder bumps being adapted to a frequency of the electromagnetic radiation, wherein the distances between the solder bumps in the chain structure prevent electromagnetic radiation from penetrating through a gap between the circuit board and the cover, so as to provide an integrated shield to shield the electromagnetic radiation from the circuit board, so that the solder bumps are arranged in a row in the clamp edge of the circuit board for shielding the electromagnetic radiation, wherein a clamp device presses the cover onto the circuit board so as to join the circuit board to the cover, and wherein the joining of the cover also has the result that the solder bumps are pressed in so as to produce an electrical contacting, and wherein the electrically conductive branch lines are made thin so that during a re-melting process, the solder bumps remain circular and do not flow away.

2. The circuit board of claim 1, further comprising:
at least one electrical component situated on an upper side of the circuit board.

3. The circuit board of claim 1, wherein the solder bumps are situated closer to an outer edge of the circuit board than the EMC vias.

4. A control device for a vehicle, comprising:
a cover; and
a circuit board that includes a clamp edge for clamping on the cover covering the circuit board, the clamp edge being formed on electrically conductive layer situated on an upper side of the circuit board, and a plurality of solder bumps for shielding an electromagnetic radiation and on which the cover lies, the solder bumps being arranged in a row in the clamp edge, each of the solder bumps being insulated from the electrically conductive layer of the clamp edge by a ring of solder resist;
wherein each of the solder bumps, each of which is insulated from the electrically conductive layer by the ring of solder resist, is connected to the electrically conductive layer by a plurality of electrically conductive branch lines that bridges the ring of solder resist,
wherein the solder bumps are in a chain structure on the clamp edge, a distance between the solder bumps being adapted to a frequency of the electromagnetic radiation,
wherein the distances between the solder bumps in the chain structure prevent electromagnetic radiation from penetrating through a gap between the circuit board and the cover, so as to provide an integrated shield to shield the electromagnetic radiation from the circuit board, and
wherein the electrically conductive branch lines are made thin so that during a re-melting process, the solder bumps remain circular and do not flow away.

5. A method for producing a circuit board for a control device for a vehicle, the method comprising:
situating an electrically conductive layer so as to form a clamp edge; and
situating, in a row in the clamp edge, a plurality of solder bumps for shielding an electromagnetic radiation, each of the solder bumps being insulated from the electrically conductive layer by a ring of solder resist;
wherein each of the solder bumps, each of which is insulated from the electrically conductive layer by the ring of solder resist, is connected to the electrically conductive layer of the clamp edge by a plurality of electrically conductive branch lines that bridges the ring of solder resist,
wherein the solder bumps are in a chain structure on the clamp edge, a distance between the solder bumps being adapted to a frequency of the electromagnetic radiation,
wherein the distances between the solder bumps in the chain structure prevent electromagnetic radiation from penetrating through a gap between the circuit board and the cover, so as to provide an integrated shield to shield the electromagnetic radiation from the circuit board, so that the solder bumps are arranged in a row in the clamp edge of the circuit board for shielding the electromagnetic radiation, and wherein
the electrically conductive branch lines are made thin so that during a re-melting process, the solder bumps remain circular and do not flow away.

6. A method for producing a control device for a vehicle, the method comprising:
manufacturing a circuit board by performing the following:
situating an electrically conductive layer so as to form a clamp edge;
situating, in a row in the clamp edge, a plurality of solder bumps for shielding an electromagnetic radiation, each of the solder bumps being insulated from the electrically conductive layer of the clamp edge by a ring of solder resist;
placing a cover onto the plurality of solder bumps; and
connecting each of the solder bumps, each of which is insulated from the electrically conductive layer by the ring of solder resist, to the electrically conductive layer by providing a plurality of electrically conductive branch lines that bridges the ring of solder resist;
wherein the solder bumps are in a chain structure on the clamp edge, a distance between the solder bumps being adapted to a frequency of the electromagnetic radiation,
wherein the distances between the solder bumps in the chain structure prevent electromagnetic radiation from penetrating through a gap between the circuit board and the cover, so as to provide an integrated shield to shield the electromagnetic radiation from the circuit board, so that the solder bumps are arranged in a row in the clamp edge of the circuit board for shielding the electromagnetic radiation, and
wherein the electrically conductive branch lines are made thin so that during a re-melting process, the solder bumps remain circular and do not flow away.

7. The method of claim 6, wherein the placing includes pressing the cover against the circuit board.

8. The method of claim 6, wherein the placing includes joining the cover to the circuit board.

* * * * *